United States Patent
Lo et al.

[11] Patent Number: 5,703,538
[45] Date of Patent: Dec. 30, 1997

[54] RADAR EXCITER LOCAL OSCILLATOR PHASE LOCK ACQUISITION CONTROL CIRCUIT

[75] Inventors: Chester K. C. Lo, Los Angeles; Paul L. Tanaka, Torrance, both of Calif.

[73] Assignee: Hughes Electronics, Los Angeles, Calif.

[21] Appl. No.: 715,681

[22] Filed: Sep. 18, 1996

[51] Int. Cl.⁶ .................. H03L 7/12; H03L 7/16; H03L 7/20
[52] U.S. Cl. .................. 331/4; 331/16; 331/19; 331/25; 331/DIG. 2; 327/156
[58] Field of Search ................. 331/1 A, 2, 4, 331/9, 14, 16–19, 25, DIG. 2; 327/105, 156–159; 455/260

[56] References Cited

U.S. PATENT DOCUMENTS 5,015,971 5/1991 Taylor et al. ................. 331/16

*Primary Examiner*—David Mis
*Attorney, Agent, or Firm*—Leonard A. Alkov; Wanda K. Denson-Low

[57] ABSTRACT

A phase lock acquisition control circuit for the local oscillator (LO) of a radar exciter. The control circuit includes a programmable logic array, a microsequencer and a counter employed as a divide-by-eight circuit which supplies a clock reference for the control circuit. The counter in turn is clocked by a crystal based oscillator also used as the reference for the exciter phase lock loop. The marker filter and zero beat detector provide frequency location information to the control circuit. The control circuit controls a ramp generator circuit which in turn can drive the phase lock loop VCO during acquisition.

4 Claims, 5 Drawing Sheets

FIG. 5a. VCO CONTROL RAMP
FIG. 5b. MARKER FILTER DETECT
FIG. 5c. ZERO BEAT DETECT
FIG. 5d. LOCK INDICATOR

RADAR EXCITER LOCAL OSCILLATOR PHASE LOCK ACQUISITION CONTROL CIRCUIT

This invention was made with Government support under N00019-89-C-0130 awarded by the Department of the Navy. The Government has certain rights in this invention.

FIELD OF THE INVENTION

The present invention relates to exciters used in active radar systems, and more particularly to a phase lock acquisition control circuit for the local oscillator of the exciter.

BACKGROUND OF THE INVENTION

In the future radar sets will require expanded capabilities from the exciter architecture of conventional equipment, such as extension of the band coverage while preserving or improving the frequency agility and spurious signal performance. Since the hardware for performing the function of the exciter in an airborne radar is limited to a fixed amount of volume, the condensation of functions to acquire the improved performance does not come cheaply.

Prior techniques for providing spectrally pure signals for radar use have been a compromise between performance and size. One of the techniques employs a harmonic phase lock loop followed by an offset loop. Though this arrangement gives good noise and spurious performance, it is rather slow in frequency switching time and is bulky.

A second prior technique employs direct synthesis methods, gives good frequency switching time and finer frequency switching time and finer frequency steps, but is limited in noise performance due to the extensive use of dividers in the RF circuit and is very volume consuming.

A third prior technique uses an indirect synthesis method to create the desired output frequency. This method is very rapid in frequency switching and can create very fine frequency steps but is limited in performance by poor FM noise due to divider networks.

None of these techniques can provide a rapidly switched, spectrally pure, coherent signal over a broad band (15%) while constrained to the volume of a airborne radar unit. The circuitry disclosed in U.S. Pat. No. 5,015,971 can satisfy all of these parameters except for the volume requirement.

SUMMARY OF THE INVENTION

A radar exciter is described which includes a reference generator for generating a reference signal having a precise reference frequency and a phase lock loop responsive to the reference signal for producing the exciter output signal, the loop closed around a phase comparator responsive to the reference signal and the exciter output signal and a voltage controlled oscillator (VCO) responsive to an output of the phase comparator for producing the exciter output signal. A rapid phase lock acquisition circuit has an output connected to the VCO during a phase acquisition mode for driving the VCO to a commanded frequency and rapidly achieving phase lock.

In accordance with the invention, a programmable controller and ramp generator circuit for the acquisition circuit includes a controller comprising a programmable microsequencer, a programmable logic array, and a counter circuit. The controller receives a plurality of input signals, and in response to the input signals generates a plurality of digital output control signals. A ramp generator circuit is responsive to the digital output control signals for generating ramp signals at the output connected to the VCO during a phase acquisition mode. The input signals include a zero beat signal used by the controller to count harmonics and indicate out-of-lock conditions, digital channel select signals for instructing the controller which frequency or channel to which the phase lock loop is to be phase locked, a marker filter signal providing information as to where the exciter output signal is with respect to the ramp signals provided to the VCO, and a reference signal whose frequency is divided by the counter to provide clock signals for the controller. The digital output control signals include digital ramp slope control signals, digital ramp start/stop signals and digital ramp direction signals.

BRIEF DESCRIPTION OF THE DRAWING

These and other features and advantages of the present invention will become more apparent from the following detailed description of an exemplary embodiment thereof, as illustrated in the accompanying drawings, in which:

FIGS. 5A–5D are timing diagrams further illustrative of the phase lock acquisition sequence.

DETAILED DESCRIPTION OF THE PREFERRED EMBODIMENT

Figure 1:
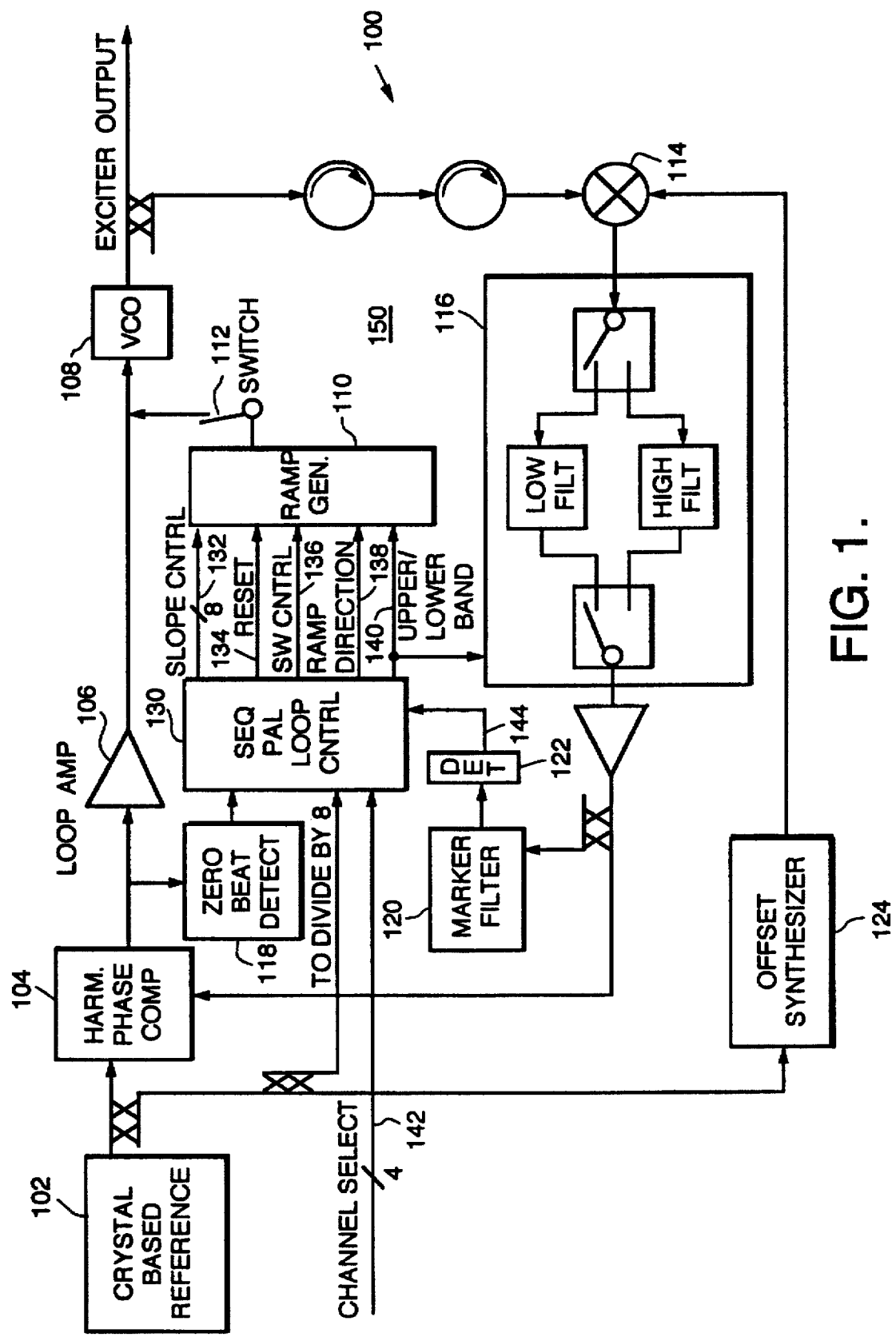
FIG. 1 is a simplified schematic diagram of a radar exciter embodying the invention.

This invention is embodied in a phase lock acquisition controller 130 for the local oscillator (LO) of a radar set exciter. Referring now to FIG. 1, the phase lock acquisition control circuit 130 in accordance with the invention is part of a microwave reference 100 which comprises a crystal stabilized oscillator (XO) 102, a harmonic phase comparator (HPC) 104, a loop amplifier 106, a voltage controlled oscillator (VCO) 108, a multi-sloped ramp generator 110 with switch 112, a mixer 114, a switched filter 116, a zero beat detector (ZBD) 118, a marker filter 120 followed by a detector 122 in the form of a power threshold detector circuit, and an offset synthesizer 124 which provides fine frequency steps with mixer 114. The switched filter 116 reduces unwanted mixing products produced by the mixer 114. The broad operating band excludes the use of a single filter, due to the amount of rejection required very close in frequency to either of the passband edges. Thus, splitting the harmonic band into two halves simplifies the filter design.

The exciter produces an exciter output signal from the phase lock loop 150, which at steady state (switch 112 open) is closed around the phase comparator 104, loop amplifier 106, VCO 108, mixer 114 and filter 116.

Figure 2:
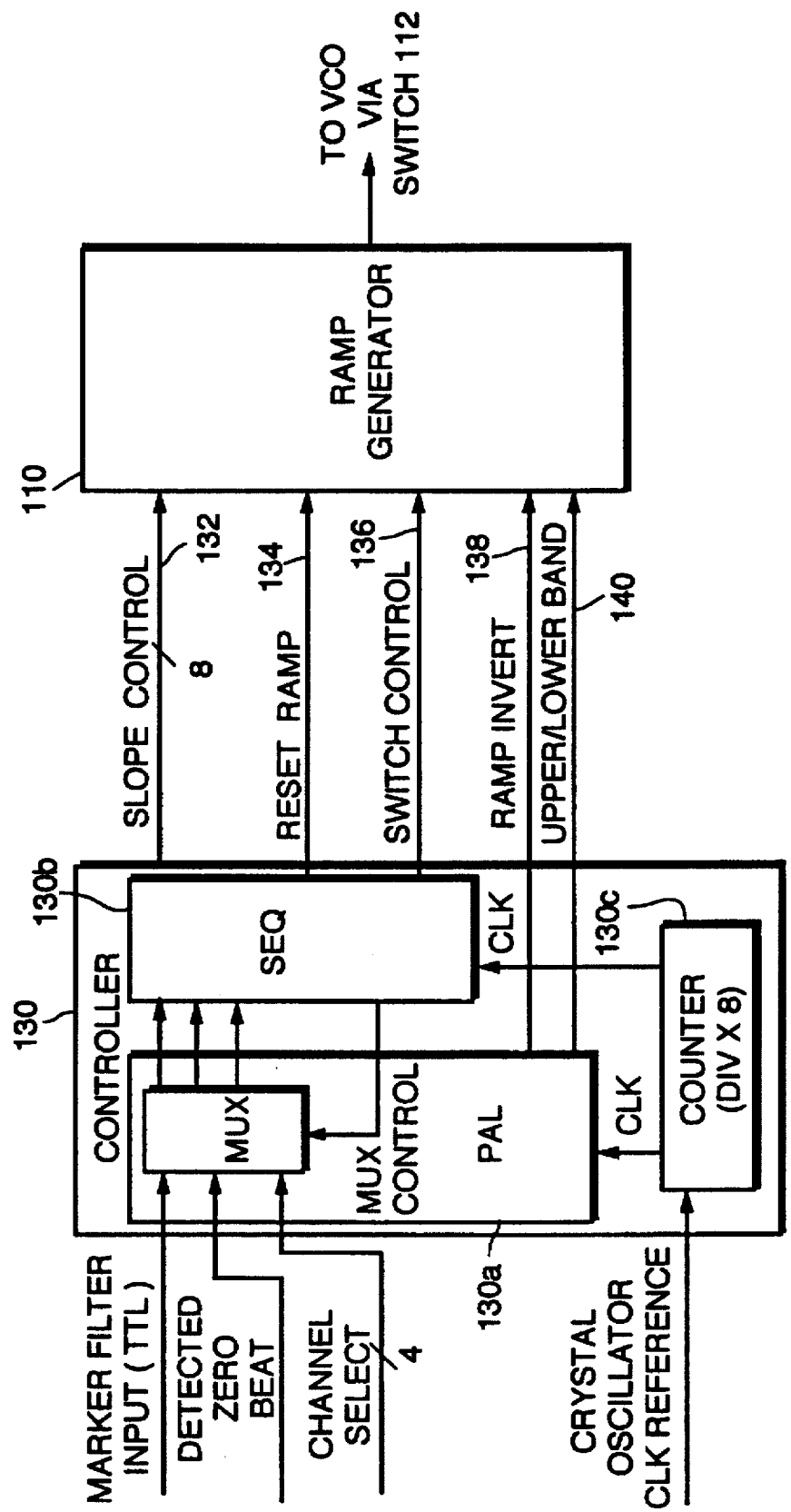
FIG. 2 illustrates the interface between the controller and ramp generator of the exciter of FIG. 1.

In an exemplary embodiment shown in FIG. 2, the controller 130 includes a programmable logic array (PLA) 130A, a 512 word×36 bit PROM-based microsequencer (SEQ) 130B, and a counter 130C used as a divide-by-8 device which supplies a clock reference for the PLA and SEQ. The counter obtains its input from XO 102, which is also used as the reference for the phase lock loop.

The PLA 130A performs several functions. It compares the channel select value 142 with the value of the previous channel select signal, and if the two are different, indicating a new channel is being commanded, the PLA will command the sequencer 130B to start the phase lock cycle. The PLA also synchronizes and multiplexes all asynchronous input signals, including the detector output signal 144 and the output of the ZBD 118, to the sequencer. The PLA further performs some miscellaneous logic functions, such as logic level conversion.

PLA devices suitable for the purpose of PLA 130A are commercially available. One exemplary device is the 22V10 PLA device marketed by Advanced Micro Devices.

The sequencer 130B in this exemplary embodiment is a PROM (programmable read only memory) based state machine. It executes a sequence of instructions, such as jump, loop, subroutine call, etc. and outputs various control signals based upon input stimuli from the PLA 130A and the current state. Devices suitable for the purpose are commercially available. One such device is the Altera EPS448 device.

The marker filter 120 and zero beat detect circuit 118 are implemented to give frequency location information (digital signals) to the controller 130. The marker filter 120 gives the acquisition circuit information as to where the output frequency is with respect to the stimulus given to the VCO 108 via the ramp generator circuit 110.

The portions of the exciter from which the phase lock acquisition controller 130 get its inputs are the marker filter 120, the ZBD signal from ZBD 118, the XO 102, and external channel select stimuli to command the controller 130 which frequency channel to phase lock to.

The ZBD signal from ZBD 118 is used by the controller 130 to count harmonics, and also cues the controller when an out-of-phase lock condition occurs. The XO 102 provides the clock frequency for the controller 130.

Figure 3:
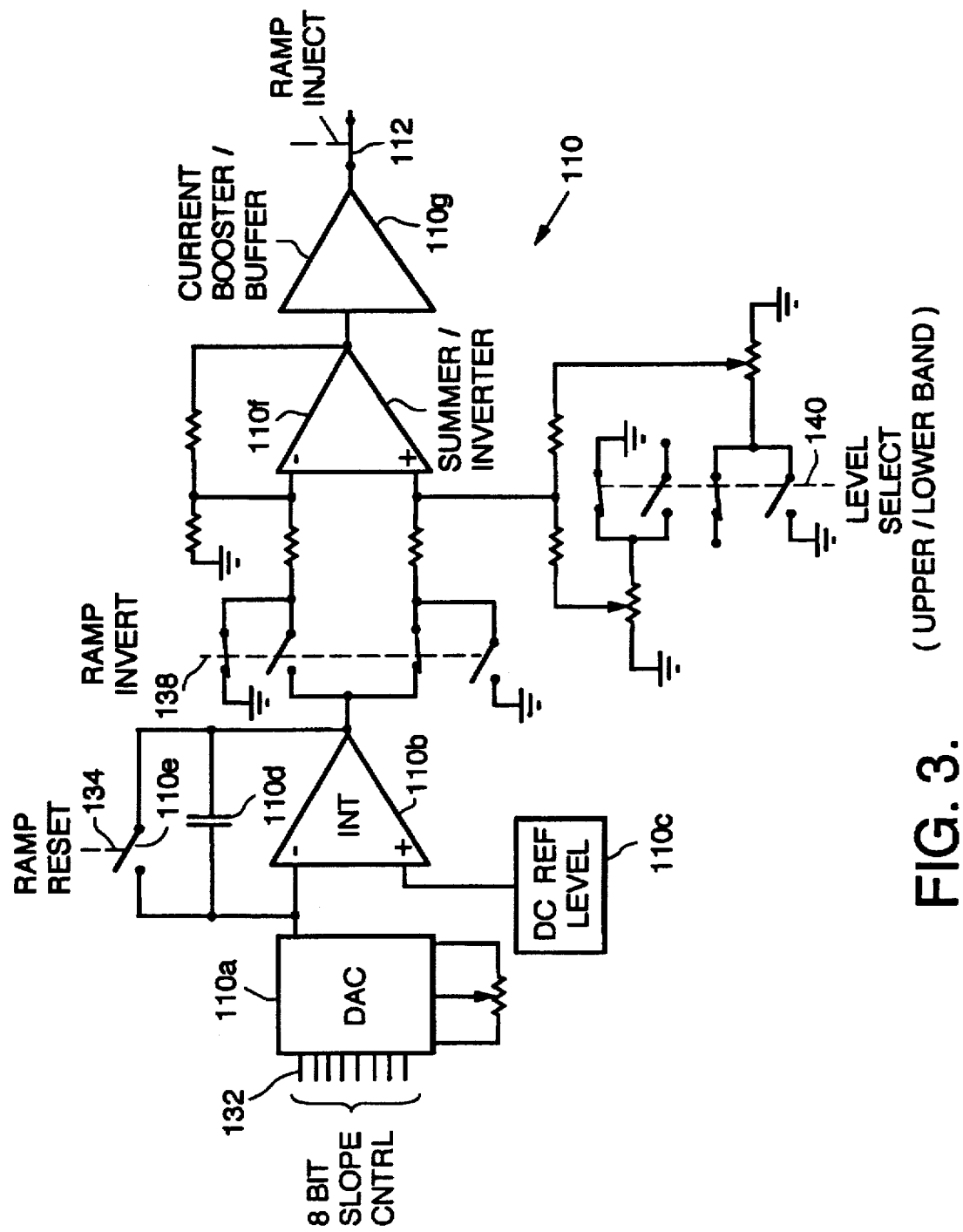
FIG. 3 is a schematic diagram of the ramp generator of the exciter of FIG. 1.

All of the outputs of the controller 130 go to a ramp generator circuit 110; a schematic of an exemplary implementation is shown in FIG. 3. These outputs are the following: 8 lines comprising bus 132 which go to a digital-to-analog converter (DAC) 110A to control the slope of the ramp via an integrator 110B; one line 134 to reset the ramp; one line 136 to control the switch 112; one line 138 which commands the ramp to have a positive/negative slope (ramp invert); and one line 140 to command the ramp to operate in either the lower/upper portion of the frequency band, and command the switched filter to be in the upper/lower filter.

The DC reference level 110C creates a starting voltage for the ramp. The integrator amplifier 110B is both an integrator and summing amplifier which sums the DC reference to the voltage of the capacitor 110D which is charged up by the DAC current. The ramp reset signal 134 closes the switch 110E to reset the ramp. When the ramp invert signal 138 is present, the slope of the ramp is inverted from the normally positive going ramp, to a negative slope. The level select signal switches in an offset voltage to the ramp which is summed at amplifier 110F to create the ramp output which is switched to the VCO 108 via the switch 112. The current booster/buffer amplifier 110G supports the current consumption demands of the VCO.

The control lines from the controller 130 to the ramp generator 110 are necessary for the exciter to be able to achieve phase lock in a short period of time (e.g., in one exemplary embodiment, less than 40 microseconds). Most of the channel acquisition time is spent in a sweep mode.

To achieve a reliable lock sequence in the minimum amount of channel acquisition time, the frequency band is split into four different regions. The VCO 108 is pulled by the acquisition ramp generator 110 first by a fast sloped ramp, then by a slow ramp and finally to the point of the desired zero beat (harmonic or channel), at which time the ramp generator 110 is removed from the VCO 108 via a opened switch 112, and the closed loop bandwidth of the phase locked loop (comprising harmonic phase comparator 104, loop amplifier 106, VCO 108, mixer 114 and offset synthesizer 124, and loop filter 116) holds the frequency at the lock point. The controller 130 is instrumental in orchestrating all of the events toward achieving phase lock to the proper harmonic (channel).

Figure 4:
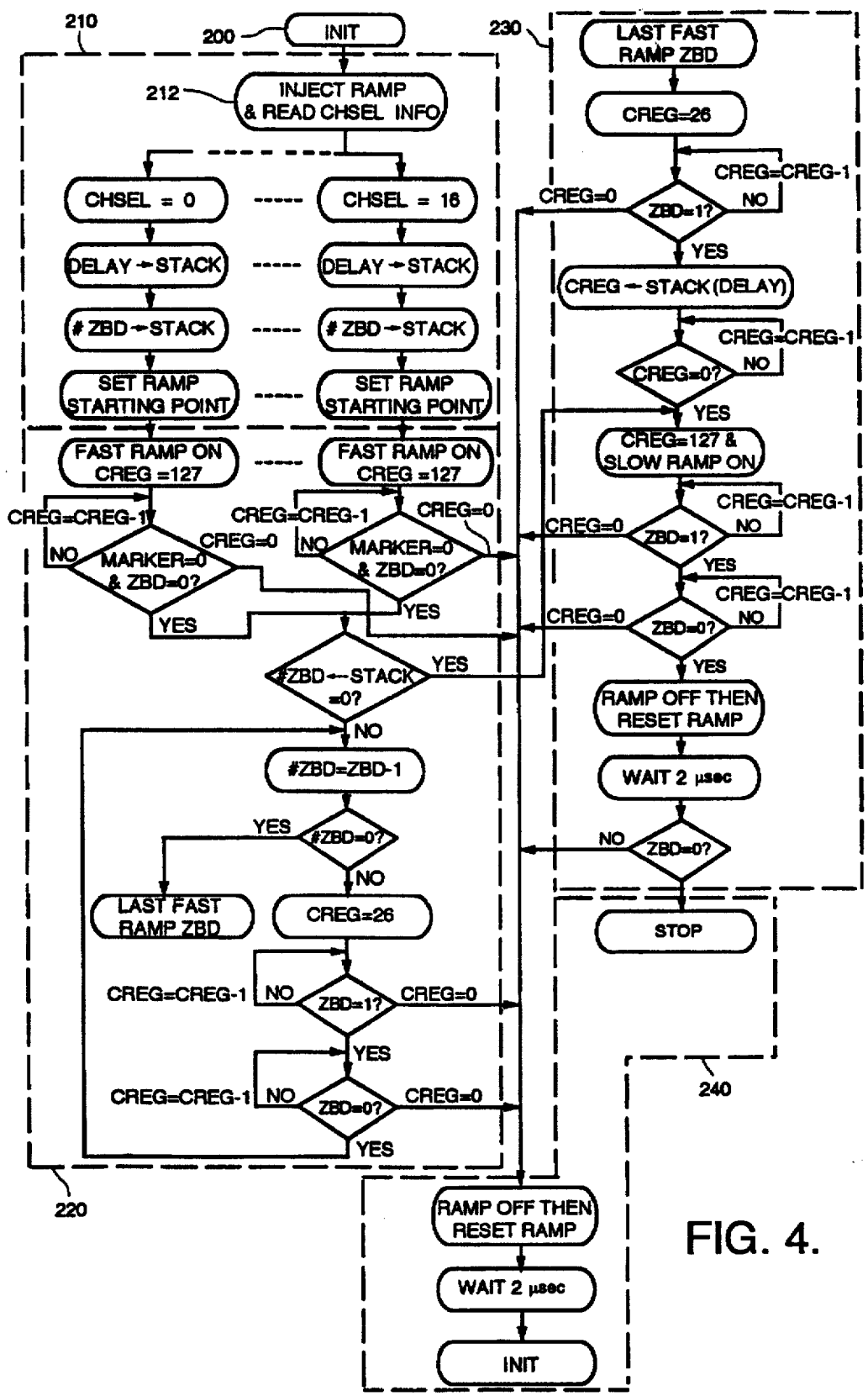
FIG. 4 is a flow diagram illustrating the phase lock acquisition sequence in accordance with the invention.

The phase lock acquisition cycle is broken down to five steps. FIG. 4 is a flow diagram of the process. FIGS 5a–5d illustrate timing diagrams of the phase lock acquisition sequence. First, the controller 130 awaits a change in the channel select lines 142 or a change in the logic state of the ZBD 118, indicating the out-of-lock condition. This initiates (step 200) the acquisition cycle by enabling the divide-by-eight counter 130C and resets the SEQ 130B.

During the second step, indicated generally within phantom box 210, the SEQ 130B and PAL 130A decode the channel select input 142 (CHSEL), set the ramp sweep rate to fast (via the eight control lines 132 to the DAC in the ramp generator 110) and pretune the VCO 108 via the lower/upper band and positive/negative slope commands 140 and 138, which are set dependent upon which channel is selected to be acquired. Indicated within 210 are 16 channels, channels 0 to 15, from which the channel is selected. The pretuning of the VCO 108 takes the output frequency of the exciter above or below the marker filter 120. This is also dependent on which channel is to be acquired.

The convention employed in FIG. 4 is that whenever there is a CREG=xxx associated with a ZBD=1,0 decision diamond, the sequencer is waiting for the proper input from the zero beat detector to occur within xxx number of clock cycles. If the input from the ZBD does not occur within xxx cycles, then operation returns to step 200 (INIT).

In the third step, indicated generally within phantom box 220 (FIG.4), the ramp generator 110 is started (FIG. 5a) and the controller 130 awaits the occurrence of the marker filter 120 signal (FIG. 4b) before proceeding any further. As the frequency of the VCO 108 goes past the marker filter, the detector in the marker filter changes its logic state, which cues the controller where in frequency it is currently operating. As the ramp continues to sweep the VCO 108, the output of the ZBD 118 gives the controller 130 a signal each time a zero beat is encountered (FIG. 5c). The ZBD signal is counted by the controller 130. When the N–1 count is reached the controller changes the 8-bit pattern going to the DAC of the ramp generator 110, forcing the ramp to slow down (shallower slope), as shown in FIG. 5a.

During the fourth step indicated generally within phantom box 230 (FIG.4), while the VCO 108 is being swept slowly, the controller 130 awaits a signal from the ZBD 118 which indicates that the Nth harmonic is reached. When the Nth harmonic is reached the controller 130 opens the switch 112 between the ramp generator 110 and VCO 108, and waits for two microseconds before checking the ZBD 118 again to insure that phase lock is achieved, as shown in FIG. 5d.

During the fifth step, indicated generally within phantom box 240 (FIG. 4) after insuring phase lock, the divide-by-eight counter is disabled to eliminate any spurious signals which may be generated by the clock circuit from getting onto the exciter output, the ramp generator 110 is reset and the controller awaits a new channel command from external stimuli or an out-of-lock command from the ZBD 118 which returns operation back to the first step.

The invention has several advantages over previous LO phase locked loop control designs, including the following.

1. The microsequencer and PAL can economically perform the function of controlling the phase lock acquisition in one-eighth the volume that medium scaled integrated circuits would require for the same function.

2. By being programmable, this invention offers a higher degree of flexibility in the timing and sequence controls of the phase locked loop over what can be offered by fixed algorithm hardware.

3. Since the invention is driven by a clock based on the crystal reference of the phase locked loop, the occurrence of a spurious signal on the output frequency of the local oscillator created by the SEQ clock is nonexistent.

4. The SEQ controls a very complex sequence of events toward rapidly acquiring phase lock to any one of many channels (number dependent on the spacing in frequency between channels and the band coverage of the LO).

5. Upon detecting either an out-of-lock condition or a condition where phase lock is not achieved in a prescribed amount of time, the sequencer can be programmed to initiate the phase lock acquisition routine.

6. Since the SEQ 130B and PAL 130A are fully programmable, the invention can be adapted for use in controlling LO's with different frequencies and number of channels.

The invention's compactness and programmability economically lends its use toward future airborne phase locked loop control designs where a complex set of bits must be used to rapidly set up lock acquisition and ramping routines for channel hopping with broadband multichanneled LOs.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. In a radar exciter including a reference generator for generating a reference signal having a precise reference frequency, a phase lock loop responsive to the reference signal for producing the exciter output signal, the loop closed around a phase comparator responsive to the reference signal and the exciter output signal and a voltage controlled oscillator (VCO) responsive to an output of the phase comparator for producing the exciter output signal, and a rapid phase lock acquisition circuit having an output connected to the VCO during a phase acquisition mode for driving the VCO to a commanded frequency and rapidly achieving phase lock, a programmable controller and ramp generator circuit comprising:

a controller comprising a programmable microsequencer, a programmable logic array, and a counter circuit, the controller receiving a plurality of input signals and in response to the input signal generating a plurality of digital output control signals; and a ramp generator circuit responsive to the digital output control signals for generating ramp signals at the output connected to the VCO during a phase acquisition mode; and wherein said input signals include a zero beat signal used by the controller to count harmonics and indicate out-of-lock conditions, digital channel select signals for instructing the controller which frequency or channel to which the phase lock loop is to be phase locked, a marker filter signal providing information as to where the exciter output signal is with respect to the ramp signals provided to the VCO, and the reference signal whose frequency is divided by the counter to provide clock signals for the controller; and wherein the digital output control signals include digital ramp slope control signals, digital ramp start/stop signals and digital ramp direction signals.

2. The circuit of claim 1 wherein the clock circuit comprises a counter responsive to the precise reference frequency for dividing the reference frequency down to the clock frequency.

3. A radar exciter comprising:

a reference generator for generating a reference signal having a precise reference frequency;

a phase lock loop (PLL) responsive to the reference signal for producing the exciter output signal, the loop closed around a harmonic phase comparator, a voltage controlled oscillator (VCO), the exciter output being taken at the VCO output, and an offset signal mixer for mixing the VCO signal with a fine frequency control offset signal, the output of the mixer fed through a switched filter responsive to a filter select signal for switching in a low band filter or a high band filter, the output of the switched filter fed back to the harmonic phase comparator for comparison with the reference signal, wherein the PLL may be locked to a harmonic of the reference signal, the switched filter for providing rejection of unwanted mixing products produced by the mixer; and a rapid phase lock acquisition circuit having an output connected to the VCO during a phase acquisition mode for driving the VCO to a commanded frequency and rapidly achieving phase lock, the phase lock acquisition circuit including a programmable controller and ramp generator circuit comprising:

a controller comprising a programmable microsequencer, a programmable logic array, and a counter circuit, the controller receiving a plurality of input signals and in response to the input signal generating a plurality of digital output control signals; and a ramp generator circuit responsive to the digital output control signals for generating ramp signals at the output connected to the VCO during a phase acquisition mode; and wherein said input signals include a zero beat signal used by the controller to count harmonics and indicate out-of-lock conditions, digital channel select signals for instructing the controller which frequency or channel to which the phase lock loop is to be phase locked, a marker filter signal providing information as to where the exciter output signal is with respect to the ramp signals provided to the VCO, and the reference signal whose frequency is divided by the counter to provide clock signals for the controller; and wherein the digital output control signals include digital ramp slope control signals, digital ramp start/stop signals which cause the ramp generator circuit to be disconnected from the VCO, a filter select signal for selecting either the low band filter or the high band filter comprising the switched filter, and digital ramp direction signals.

4. The exciter of claim 3 wherein the clock circuit comprises a counter responsive to the precise reference frequency for dividing the reference frequency down to the clock frequency.

* * * * *